(12) United States Patent
Leitch

(10) Patent No.: US 7,141,865 B2
(45) Date of Patent: Nov. 28, 2006

(54) LOW NOISE SEMICONDUCTOR AMPLIFIER

(76) Inventor: James Rodger Leitch, 7 Lakes Lane, Beaconsfield, Bucks (GB) HP9 2LA ( * ) Notice: Subject to any disclaimer, the term of this patent is extended or adjusted under 35 U.S.C. 154(b) by 506 days.

(21) Appl. No.: 10/151,759

(22) Filed: May 22, 2002

(65) Prior Publication Data
US 2002/0195684 A1     Dec. 26, 2002

Related U.S. Application Data

(60) Provisional application No. 60/292,458, filed on May 21, 2001.

(51) Int. Cl.
*H01L 29/73* (2006.01)
(52) U.S. Cl. .............. 257/593; 257/577; 257/587; 257/592; 257/E29.124; 438/329; 438/350
(58) Field of Classification Search .......... 257/592, 257/593, 653, 655, 583, 577, 197, 198, 565, 257/578, 579, 580, 584, 587, 557, 558, 563, 257/564, E29.124, E29.044; 438/335, 329, 438/350
See application file for complete search history.

(56) References Cited

U.S. PATENT DOCUMENTS

| 2,895,058 | A | * | 7/1959 | Pankove | 327/582 |
|---|---|---|---|---|---|
| 3,802,968 | A | * | 4/1974 | Ghosh et al. | 438/349 |
| 3,955,154 | A | * | 5/1976 | Sasaki et al. | 331/111 |
| 4,302,691 | A | * | 11/1981 | Kelley | 307/592 |
| 4,529,947 | A | * | 7/1985 | Biard et al. | 330/259 |
| 4,639,686 | A | * | 1/1987 | Beckenbach et al. | 330/307 |
| 4,901,122 | A | * | 2/1990 | Xu et al. | 257/26 |
| 5,160,899 | A | * | 11/1992 | Anderson et al. | 330/288 |
| 5,274,267 | A | * | 12/1993 | Moksvold | 257/592 |
| 5,352,911 | A | * | 10/1994 | Grossman | 257/198 |
| 5,719,432 | A | * | 2/1998 | Kariyazono et al. | 257/565 |
| 6,066,863 | A | * | 5/2000 | Fujishima | 257/133 |
| 2001/0013610 | A1 | * | 8/2001 | Chi et al. | 257/197 |

OTHER PUBLICATIONS

Horowitz et al., The Art of Electronics, 1989,Cambridge University Press, pp. 42, 76 and 77.*

* cited by examiner

*Primary Examiner*—B. William Baumeister
*Assistant Examiner*—Steven J. Fulk

(57) ABSTRACT

A Low Noise semiconductor amplifier structure formed from layers of differently doped semiconductor material.

This structure when properly biased will amplify voltage signals applied to the input terminal (Base1 or signal-base), and provide the same signal, amplified at the terminal designated as the output or collector. The semiconductor material can be any of a number of semiconductor materials, Germanium, Silicon, Gallium-Arsenide or any material with suitable semi-conducting properties. The structure can be any BJT (Bipolar Junction Transistor) form.

The presence of an additional, distinct highly doped layer indicated as Base2 in the BJT form, provides an electrical noise suppression function. This inhibits intrinsic electrical noise, and improves the high frequency performance of the device in conjunction with an external capacitor connected to this new Base2 (or anti-base) region. This layer when properly biased reduces the inherent noise levels due to shot and flicker noise in the semiconductor structure to very low levels.

7 Claims, 1 Drawing Sheet

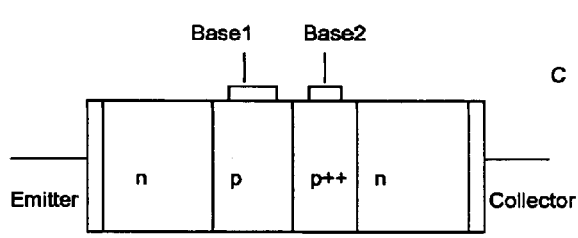
Figure 1
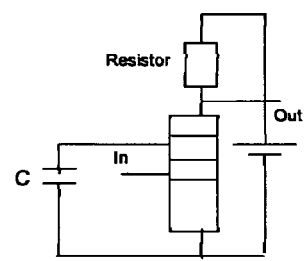
Figure 2  BJT
Electrical connections
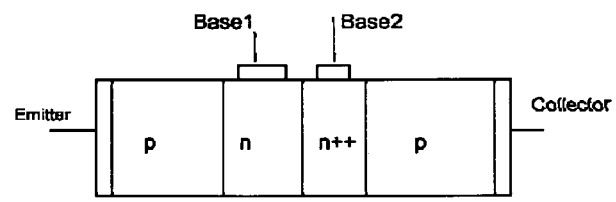
Figure 3  BJT
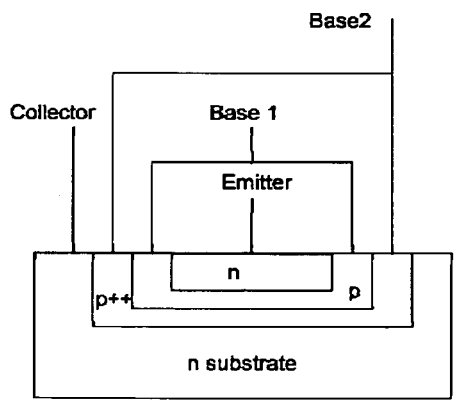
Figure 4
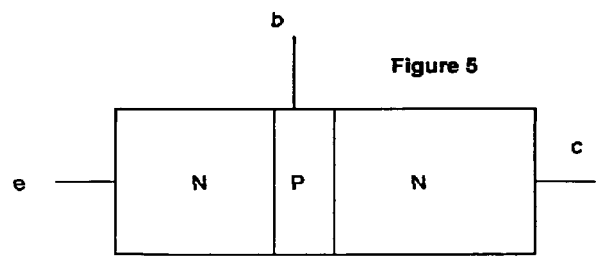
Figure 5
Prior Art

LOW NOISE SEMICONDUCTOR AMPLIFIER

CROSS-REFERENCE TO RELATED APPLICATIONS

UK Patent application No: GB 9915855.2 Filed Jul. 7, 1999. This is the USPTO filing of the UK Patent application titled "A low noise semiconductor amplifier" with modifications to the original UK patent. USPTO provisional filing number: 60292458 filed May 21, 2001 filed prior to UK publishing date.

STATEMENT REGARDING FEDERALLY SPONSORED RESEARCH OR DEVELOPMENT

Not applicable. No Federally sponsored Research and Development.

REFERENCE TO A MICROFICHE APPENDIX

Not applicable.

BACKGROUND OF THE INVENTION

Technical Field

This invention relates to the design of a Low Noise Semiconductor Amplifier.

The use of the BJT (Bipolar Junction Transistor) is a well-known semiconductor device in the field of electronics for amplifying electrical signals. The BJT devices suffer from imperfections in the form of inherent or intrinsic electrical noise, which reduces the effectiveness of the devices at very low signal levels. The signal to noise ratio is commonly regarded as a measurement of the effectiveness of a given amplifier to amplify the signal as a ratio of the noise floor level. Two predominant forms of noise dominate the noise levels achievable in BJT semiconductor devices, namely SHOT and FLICKER noise.

This device will increase the signal to noise ratio and allow applications with much greater amplifier sensitivity to be achieved, and also applications with more stable time based results, due to the reduction of phase noise. This is achieved by incorporating an intermediate diffusion region into the semiconductor device, along with an external component to reduce the above two noise forms. Prior art has been to reduce the semiconductor amplifier FLICKER noise, by using superior fabrication techniques to reduce the impurity content of the semiconductor device or substrate. Prior art has involved reducing intrinsic resistance paths within the device to reduce the levels of THERMAL noise. This has normally taken the form of reducing the base spreading resistance in the case of a BJT (Bipolar Junction Transistor).

BRIEF SUMMARY OF THE INVENTION

The addition of a new or fourth distinctive highly doped semiconductor region in any BJT device can reduce the levels of both Shot and Flicker noise to a much lower level than can be achieved in the conventional device design. This extra region alters the behavior of the charge carriers in the silicon, to reduce the electrical charge fluctuations forming the noise. This additional highly doped region can be brought out to an external connection, and connected to an external capacitor, to provide in addition to noise reduction, enhancements in the high frequency performance of the device. The effect of this extra control region reduces the spectral density of the noise fluctuations in the collector or drain current of the device, by virtue of the additional capacitance, intrinsic and external, to the highly doped region, and due to the increased recombination of minority carriers in this extra Base2 region.

BRIEF DESCRIPTION OF THE SEVERAL VIEWS OF THE DRAWING

FIG. 1 shows the addition of the new highly doped layer in an idealized diagram of transistor.

FIG. 2 shows the electrical connection of the layer in a BJT transistor in an amplifier schematic.

FIG. 3 shows the addition of the new layer in an idealized PNP transistor.

FIG. 4 shows the addition of the new highly doped layer in a typical example of an NPN transistor.

FIG. 5 shows a conventional idealized NPN Bipolar transistor structure.

DETAILED DESCRIPTION OF THE INVENTION

Bipolar Junction Transistor

The normal process for making a NPN Bipolar Junction Transistor is to fabricate a junction as shown in the idealized form of FIG. 5 below. The starting N substrate is implanted by a 'P' type diffusion as shown to form the base region of the transistor. The next stage is the implant a 'N' type diffusion, to change the semiconductor back to a 'N' type region for creating the emitter junction.

Metal depositions are then made onto each of the three distinct regions to create the external connections for connecting the semiconductor device onto other external components to form an amplifying function. This is by means of the emitter (e), base (b) and collector (c) contacts.

The fabrication profile of the new "Low noise semiconductor amplifier" with one particular physical form of a N-P-N construction is now described with reference to FIG. 4. This example shows the planar or lateral form of an NPN transistor.

The fabrication process starts with the same 'N' type substrate and a high impurity 'P++' dopant is applied to the substrate. This creates the new Base2 region used in this low noise structure.

This 'P++' diffusion is followed by a normal 'P' type diffusion, but for slightly less duration, creating a second 'Base1' region. The slightly shorter diffusion time creates a thin 'Base2' region inserted between the collector and 'Base1' region. The emitter 'N' type diffusion or implant then creates the emitter region. The above process can also be used with the reverse and subsequent process steps to create a P-N-P device, or the new PNP (P-N1-N2-P) structure as described in the idealized diagram in FIG. 3.

The shot noise is due to the individual charge carriers crossing the emitter base junction in the case of a BJT device. The addition of the highly doped layer acts as an equi-potential surface to 'smooth' those fluctuations, and reduce the spectral density of the current flow.

This is achieved by making an electrical connection to the new Base region 'Base2' in the semiconductor structure. This electrical connection is used to connect this new additional region to a capacitive device, to create a charge reservoir, or equi-potential zone, through which all the charge carriers must flow. The minority carriers are either holes in the PNP (P-N1-N2-P) structure, or electrons in the NPN (N-P1-P2-N) structure, must pass through this zone as the move from the emitter to the collector region.

The fundamental difference between prior-art, and this invention, is the creation of a low spectral density junction, created by the additional highly doped diffusion region. The flicker noise component is also reduced in amplitude due to the same mechanism.

The addition of this highly doped region also behaves as a screen between the collector of the device and the input base, to enhance its high frequency performance.

Base 1 will also be referred to as the signal-base connection, and the Base2 as the anti-base connection.

This enhancement in the high frequency performance is due to a reduction in the "Miller capacitance". This is achieved by de-coupling the new highly doped region to ground, and so, reducing the inherent collector to Base1 (or signal-base) capacitance of the BJT.

DETAILED DESCRIPTION OF THE INVENTION (CONTINUED)

The highly doped region in the case of a BJT can be a graded base junction, with a connection being made to the more highly doped area of the base region.

The external connection can be eliminated in the case of integrated circuit applications, and the intrinsic capacitance of the highly doped region, or another silicon structure with a high substrate capacitance, used to provide some level of additional noise reduction over a conventional BJT structure. The addition of this additional highly doped region (Base2) has the effect of acting as an electrostatic screen between the original 'Base1' region and the collector junction, and so reducing the Miller capacitance.

The connection of the low noise semiconductor amplifier is shown in FIG. 2, where the input signal is applied to the 'In' terminal (signal-base), and the output signal is taken from the 'Out' terminal, and where the Base2 (or anti-base) is connected to ground by a capacitor 'C'.

This has the effect of increasing the upper useable frequency of the device.

I claim:

1. A low noise semiconductor device comprising:
   a first region doped with impurities yielding charge carriers having a first polarity, said first region having a first region electrode operatively collected to the ground;
   a second region doped with impurities yielding charge carriers having a second polarity, said second polarity being opposite said first polarity, said second region being operatively connected to said first region, said second region having a second region electrode operatively arranged to input a first signal;
   a third region doped with impurities yielding charge carriers having said second polarity, said doping and said carrier density in said third region being substantially greater than said doping and said carrier density, respectively, in said second region, said third region being operatively connected to said second region;
   a fourth region doped with impurities yielding charge carriers having said first polarity, said fourth region having a fourth region electrode operatively connected to a biasing voltage, said fourth region electrode operatively outputting a second signal, said fourth region being operatively connected to said third region;
   a capacitor having a first capacitor electrode operatively connected to said third region and a second capacitor electrode operatively grounded.

2. The low noise semiconductor device of claim 1, wherein said operative arrangements lower SHOT and FLICKER noises.

3. The low noise semiconductor device of claim 2, wherein said first, second, third, and fourth impurities are N, P, P, and N types, respectively.

4. The low noise semiconductor device of claim 2, wherein said first, second, third, and fourth impurities are P, N, N, P types, respectively.

5. The low noise semiconductor device of claim 1, wherein said third region operatively screens said second region from said fourth region, thereby enhancing the frequency performance of said device.

6. The low noise semiconductor device of claim 5, wherein said first, second, third, and fourth impurities are N, P, P, and N types, respectively.

7. The low noise semiconductor device of claim 5, wherein said first, second, third, and fourth impurities are P, N, N, P types, respectively.

* * * * *